(12) United States Patent
Seok et al.

(10) Patent No.: US 12,140,676 B2
(45) Date of Patent: Nov. 12, 2024

(54) LiDAR WITH MICROLENS ARRAY AND INTEGRATED PHOTONIC SWITCH ARRAY

(71) Applicant: nEYE Systems, Inc., Berkeley, CA (US)

(72) Inventors: Tae Joon Seok, El Cerrito, CA (US); Xiaosheng Zhang, Davis, CA (US); Kyungmok Kwon, El Cerrito, CA (US); Ming Chiang A. Wu, Piedmont, CA (US)

(73) Assignee: nEye Systems, Inc., Emeryville, CA (US)

( * ) Notice: Subject to any disclaimer, the term of this patent is extended or adjusted under 35 U.S.C. 154(b) by 0 days.

(21) Appl. No.: 17/748,759

(22) Filed: May 19, 2022

(65) Prior Publication Data
US 2022/0373688 A1    Nov. 24, 2022

Related U.S. Application Data

(60) Provisional application No. 63/190,672, filed on May 19, 2021.

(51) Int. Cl.
G01S 17/89    (2020.01)
G01S 7/481    (2006.01)
G01S 7/4863   (2020.01)
H01L 31/107   (2006.01)

(52) U.S. Cl.
CPC .............. *G01S 17/89* (2013.01); *G01S 7/481* (2013.01); *G01S 7/4863* (2013.01); *H01L 31/107* (2013.01)

(58) Field of Classification Search
CPC ........ G01S 17/89; G01S 7/481; G01S 7/4863; H01L 31/107
See application file for complete search history.

(56) References Cited

U.S. PATENT DOCUMENTS

| 5,543,805 A | 8/1996 | Thaniyavar |
| 5,761,352 A | 6/1998 | Kitajima et al. |
| 6,028,973 A | 2/2000 | Schienle et al. |

(Continued)

FOREIGN PATENT DOCUMENTS

| CN | 1656721 A | 8/2005 |
| CN | 102576130 A | 7/2012 |

(Continued)

OTHER PUBLICATIONS

NPL1 "Lens Spacers, Shims, and Focal Length Extenders" Edmund Optics Inc. (Year: 2022).*

(Continued)

*Primary Examiner* — Isam A Alsomiri
*Assistant Examiner* — Sanjida Naser
(74) *Attorney, Agent, or Firm* — KNOBBE, MARTENS, OLSON & BEAR, LLP

(57) ABSTRACT

The present disclosure is directed to imaging LiDARs with optical antennas fed by optical waveguides. The optical antennas can be activated through an optical switch network that connects the optical antennas to a laser source to a receiver. A microlens array is positioned between a lens of the LiDAR system and the optical antennas, the microlens array being positioned so as to transform an emission angle from a corresponding optical antenna to match a chief ray angle of the lens. Methods of use and fabrication are also provided.

26 Claims, 17 Drawing Sheets

(56) References Cited

U.S. PATENT DOCUMENTS

| | | | |
|---|---|---|---|
| 6,160,927 A | 12/2000 | Leclerc et al. | |
| 6,218,667 B1* | 4/2001 | Nonaka | G01J 5/08 |
| | | | 250/353 |
| 6,522,427 B1 | 2/2003 | Bhattacharjya et al. | |
| 6,777,767 B2* | 8/2004 | Badehi | H03H 9/105 |
| | | | 257/434 |
| 6,842,563 B2 | 1/2005 | Zhang et al. | |
| 6,944,361 B2 | 9/2005 | Xue et al. | |
| 6,970,619 B2 | 11/2005 | Baumann et al. | |
| 7,116,856 B2 | 10/2006 | Iio et al. | |
| 8,891,914 B2 | 11/2014 | Ticknor et al. | |
| 8,938,142 B2 | 1/2015 | Shastri et al. | |
| 9,013,790 B1* | 4/2015 | Kazmierski | G03B 21/625 |
| | | | 359/453 |
| 9,405,066 B2 | 8/2016 | Mahgerefteh et al. | |
| 9,800,332 B2 | 10/2017 | Chalfant et al. | |
| 10,061,085 B2 | 8/2018 | Wu et al. | |
| 10,466,423 B2 | 11/2019 | Spector et al. | |
| 10,473,862 B2 | 11/2019 | Spector et al. | |
| 10,715,887 B2 | 7/2020 | Seok et al. | |
| 10,761,272 B2 | 9/2020 | Hosseini et al. | |
| 10,823,913 B1 | 11/2020 | Moebius et al. | |
| 11,061,234 B1* | 7/2021 | Zhu | G01S 17/10 |
| 11,360,272 B2 | 6/2022 | Seok et al. | |
| 2002/0034372 A1 | 3/2002 | Alibert et al. | |
| 2002/0186918 A1 | 12/2002 | Burroughs | |
| 2002/0186919 A1 | 12/2002 | Pepper | |
| 2003/0010827 A1 | 1/2003 | Hilton et al. | |
| 2003/0107793 A1 | 6/2003 | Capps | |
| 2003/0107798 A1 | 6/2003 | Zhang et al. | |
| 2003/0108274 A1 | 6/2003 | Haronian | |
| 2003/0108290 A1 | 6/2003 | Zhang et al. | |
| 2003/0174934 A1 | 9/2003 | Ishii et al. | |
| 2003/0198259 A1 | 10/2003 | Zhang et al. | |
| 2003/0231821 A1 | 12/2003 | Clarke et al. | |
| 2006/0061753 A1 | 3/2006 | Harris et al. | |
| 2007/0030570 A1 | 2/2007 | Jacobowitz et al. | |
| 2007/0258681 A1 | 11/2007 | Takabayashi et al. | |
| 2009/0220228 A1 | 9/2009 | Popovic | |
| 2012/0105944 A1 | 5/2012 | Wang et al. | |
| 2012/0170111 A1 | 7/2012 | Doerr et al. | |
| 2012/0314037 A1 | 12/2012 | Nehmadi et al. | |
| 2013/0336664 A1 | 12/2013 | Mack et al. | |
| 2014/0192394 A1 | 7/2014 | Sun et al. | |
| 2014/0212104 A1 | 7/2014 | Cho et al. | |
| 2014/0347733 A1 | 11/2014 | Stewart et al. | |
| 2014/0354856 A1 | 12/2014 | Zhou et al. | |
| 2015/0346340 A1 | 12/2015 | Yaacobi et al. | |
| 2016/0170287 A1 | 6/2016 | Bitauld et al. | |
| 2016/0359568 A1 | 12/2016 | De Dobbelaere et al. | |
| 2017/0186166 A1* | 6/2017 | Grunnet-Jepsen | H04N 13/239 |
| 2017/0242161 A1 | 8/2017 | Zhang et al. | |
| 2017/0374244 A1 | 12/2017 | Swaminathan et al. | |
| 2018/0088255 A1 | 3/2018 | Sakai et al. | |
| 2018/0088439 A1* | 3/2018 | Inoue | G02F 1/2955 |
| 2018/0224709 A1 | 8/2018 | Inada et al. | |
| 2019/0170937 A1 | 1/2019 | Menezo et al. | |
| 2020/0142066 A1 | 5/2020 | Sandborn | |
| 2020/0150241 A1 | 5/2020 | Byrnes et al. | |
| 2020/0209361 A1 | 7/2020 | Maier et al. | |
| 2020/0284883 A1 | 9/2020 | Ferreira et al. | |
| 2020/0303896 A1 | 9/2020 | Ohta et al. | |
| 2020/0333131 A1* | 10/2020 | Guo | H01S 5/423 |
| 2021/0116655 A1 | 4/2021 | Grieco et al. | |
| 2021/0116778 A1 | 4/2021 | Zhang et al. | |
| 2021/0181310 A1 | 6/2021 | Lu et al. | |
| 2021/0316756 A1 | 10/2021 | Davydenko | |
| 2021/0359396 A1 | 11/2021 | Mattheijssen et al. | |
| 2021/0382142 A1* | 12/2021 | Rogers | G01S 17/89 |
| 2022/0003842 A1 | 1/2022 | Wang et al. | |
| 2022/0075044 A1 | 3/2022 | Michaels et al. | |
| 2022/0214503 A1* | 7/2022 | Waldern | G02B 6/0011 |
| 2022/0236384 A1* | 7/2022 | Sutton | G01S 7/4815 |
| 2022/0291461 A1* | 9/2022 | Elsinger | G02B 6/4208 |
| 2022/0317381 A1 | 10/2022 | Seok et al. | |
| 2022/0356761 A1 | 11/2022 | Zhang et al. | |

FOREIGN PATENT DOCUMENTS

| | | |
|---|---|---|
| DE | 102018221875 A1 | 6/2020 |
| EP | 3635460 A1 | 4/2020 |
| IN | 2020/017021228 A | 8/2020 |
| JP | S56-48603 A | 5/1981 |
| JP | 09-005799 A | 1/1997 |
| JP | 2018049223 A | 3/2018 |
| KR | 10-20140138107 A | 12/2014 |
| KR | 10-20180056783 A | 5/2018 |
| WO | WO00/52763 A1 | 9/2000 |
| WO | WO2014089454 A2 | 6/2014 |
| WO | WO2017065971 A1 | 4/2017 |
| WO | WO2018/111316 A1 | 6/2018 |
| WO | WO2018/160729 A2 | 9/2018 |
| WO | WO2020/205450 A1 | 10/2020 |

OTHER PUBLICATIONS

NPL2 Glaser, Naftali Paul Eisenberg, M. Maniewicz, "Multiple lenslet array imagers and correlators," Proc. SPIE 3110, 10th Meeting on Optical Engineering in Israel, (Sep. 22, 1997) (Year: 1997).*
WO 2022011701 A1 (Yang et al.) (Year: 2022).*
WO 2020040854 A2 (Henriksson et al.) (Year: 2020).*
WO 2017132568 A1 (So et al.) (Year: 2017).*
WO 2022011701 A1 Annotated (Yang et al.) (Year: 2022).*
WO 2017132568 A1 Annotated (So et al.) (Year: 2017).*
Akihama et al.; Single and multiple optical switches that use freestanding silicon nanowire waveguide couplers; Light Science and Applications; 1(6); e16; DOI:10.1038/lSA_2012.16; 8 pages; ; Jun. 2012.
Binkert et al.; Optical high radix switch design; Micro IEEE; 32(3); pp. 100-109; Apr. 2012.
Celo et al.; 32X32 silicon photonic switch; IEEE In 2016 21st OptoElectronics and Communication Conference (OECC); pp. 1-3; Jul. 2016.
Chen et al.; Compact, low-loss and low-power 8×8 broadband silicon optical switch; Optics Express; 20(17); pp. 18977-18985; 9 pages; Aug. 2012.
Farrington et al.; Helios: a hybrid electrical/optical switch architecture for modular data centers; Proceedings of the ACM SIGCOMMM 2010 Conference; 41(4); pp. 339-350; Aug. 2010.
Han et al.; 50×50 polarization-insensitive silicon photonic MEMS switches: design and experiment; In ECOC 2016 Post Deadline Paper, 42nd European Conference on Optical Communication; pp. 1-3; Sep. 2016.
Han et al.; Large-scale silicon photonic switches with movable directional couplers; Optica; 2(4); pp. 370-375; Apr. 2015.
Han et al.; Monolithic 50×50 MEMS silicon photonic switches with microsecond response time; Optical Fiber Communication Conference, Optical Society of America; pp. M2K-2, 3 pages; Mar. 2014.
Inoue et al.; An optical scanner based on beam switching method fabricated on silicon photonics circuit; Proceedings of SPIE; Laser radar Technology and Application XXIII; Event SPIE Defense + Security, Orlando, Florida; vol. 10636; doi 10.117/12.2309304; 7 pages; May 2018.
Khope et al.; Elastic WDM crossbar switch for data centers; IEEE Optical Interconnects Conference (OI); pp. 48-49; May 2016.
Kim et al.; 1100×1100 port MEMS-based optical crossconnect with 4-dB maximum loss; IEEE Photonics Technolgy Letters Leters; 15(11); pp. 1537-1539; Oct. 2003.
Kwon et al.; 128×128 silicon photonic MEMS switch with scalable row/column addressing; CLEO Science and Innovations, Optical Society of America; pp. SF1A-4; 2 pages; May 2018.
Lee et al.; Monolithic silicon integration of scaled photonic switch fabrics, CMOS logic, and device driver circuits; journal of Lightwave Technology; 32(4); pp. 743-751; Aug. 2013.

(56) References Cited

OTHER PUBLICATIONS

Liu et al.; Circuit switching under the radar with REACToR; In 11th USENIX Symposium on network Systems Design and Implementation (NSDI 14): pp. 1-15; (the year of publication is sufficiently earlier than the effective U.S. filing date and any foreign priority date so that the particular month of publication is not in issue) 2014.

Nakamura et al.; High extinction ratio optical switching independently of temperature with silicon photonic 1×8 switch; Optical Fiber Communication Conference, Optical Society of America; pp. OTu2I-3); 3 pages; Mar. 2012.

Porter et al.; Integrating microsecond circuit switching into the data center; in ACM SIGCOMM Computer Communication Review; 43(4); pp. 447-458; Aug. 2013.

Rumley et al.; Impact of photonic switch radix on realizing optical interconnection networks for exascale systems; In IEEE Optical Interconnects Conference; pp. 98-99; May 2014.

Seok; Large scale broadband digital silicon photonic switches with vertical adiabatic couplers; Optica; 3(1); pp. 64-70; Jan. 2016.

Sun et al.; Large scale silicon photonic circuits for optical phased arrays; IEEE Journal of Selected Topics In Quantum Electronics; 20(4); pp. 264-278; 15 pages; Nov. 2013.

Suzuki et al.; Ultra-compact 8×8 strictly-non-blocking si-wire PILOSS switch; Optics Express; 22(4); pp. 3887-3894; 8 pages; Feb. 2014.

Tanizawa et al.; 32×32 Strictly non-blocking si-wire optical switch on ultra-small die of 11×25mm92; Optical Fiber Communication Conference; pp. M2B-5; 3 pages; Mar. 2015.

Tanizawa et al.; 4×4 Si-wire optical path switch with off-chip polarization diversity; IEEE Opto-Electronics and Communications Conference (OECC); pp. 1-3; Jun. 2015.

Tanizawa et al.; Non-duplicate polarization-diversity 8×8 si-wire PILOSS switch integrated with polarization splitter-rotators; Optics Express; 25(10); pp. 10885-10892; May 2017.

Tanizawa et al.; Novel polarization diversity without switch duplication of a Si-wire Piloss optical switch; Optilcs Express; 24(7); pp. 6861-6868; DOI:10.1364/OE.24.006861, 8 pages; Apr. 2016.

Tanizawa et al.; Silicon photonic 32×32 strictly-non-blocking blade switch and its full path characterization; IEEE 21st OptoElectronics and Communications Conference (OECC); pp. 1-3; Jul. 2016.

Vahdat et al.; The emerging optical data center; Optical Fiber Communication Conference; Optical Society of America; p. OTuH2; 3 pages; Mar. 2011.

Yun et al.; 2×2 adiabatic 3-dB coupler on silicon-on-insulator rib waveguides; Photonics North, SPIE; vol. 8915; pp. 251-256; 6 pages; Oct. 2013.

Zhang et al.; A 20×20 focal plane switch array for optical beam steering; IEEE 2020 Conference on Lasers and Electro-Optics (CLEO); 2 pages; May 2020.

Seok et al.; U.S. Appl. No. 17/687,372 entitled "Pseudo monostatic lidar with two-dimensional silicon photonic mems switch array," filed Mar. 4, 2022.

\* cited by examiner

LiDAR WITH MICROLENS ARRAY AND INTEGRATED PHOTONIC SWITCH ARRAY

PRIORITY CLAIM

This patent application claims priority to U.S. provisional patent application No. 63/190,672, titled "LIDAR WITH MICROLENS ARRAY AND INTEGRATED PHOTONIC SWITCH ARRAY" and filed on May 19, 2021, which is herein incorporated by reference in its entirety.

INCORPORATION BY REFERENCE

All publications and patent applications mentioned in this specification are herein incorporated by reference to the same extent as if each individual publication or patent application was specifically and individually indicated to be incorporated by reference.

FIELD

The present disclosure details novel LiDAR systems and methods. More specifically, this disclosure is directed to imaging LiDARs with microlens arrays to match the emission angles of optical antennas and the receiving angles of the imaging lens.

BACKGROUND

Light detection and ranging (LiDAR) is widely used in autonomous vehicles and portable devices such as smartphones and tablets. Solid state LiDARs are particularly attractive because they are conducive to miniaturization and mass production. US Patent Pub. No. 2021/0116778 teaches a beamsteering system consisting of a programmable array of vertical couplers (also called optical antennas) located at the focal plane of an imaging lens. Optical signal can be delivered to any selected optical antenna through a programmable optical network consisting of MEMS (micro-electromechanical system)-actuated waveguide switches. Compared with conventional thermo-optic or electro-optic switches, the MEMS switches offer lower insertion loss, lower crosstalk, broadband operation, digital actuation, and lower power consumption. High density arrays of programmable optical antennas can be integrated on single chips for high resolution imaging LiDARs, thanks to their small footprint.

Previous disclosure tailored the emission angle of individual optical antennas to match the acceptance angle of the imaging lens. The emission angles of the optical antennas in some embodiments are sensitive to the fabrication process. They may also affect the reflections back to the detectors, which are not desirable. The present disclosure describes the use of microlens arrays to match the emission angles of the antennas and the acceptance angles of the imaging lens.

BRIEF DESCRIPTION OF THE DRAWINGS

The novel features of the invention are set forth with particularity in the claims that follow. A better understanding of the features and advantages of the present invention will be obtained by reference to the following detailed description that sets forth illustrative embodiments, in which the principles of the invention are utilized, and the accompanying drawings of which:

SUMMARY OF THE DISCLOSURE

Figure 1A:
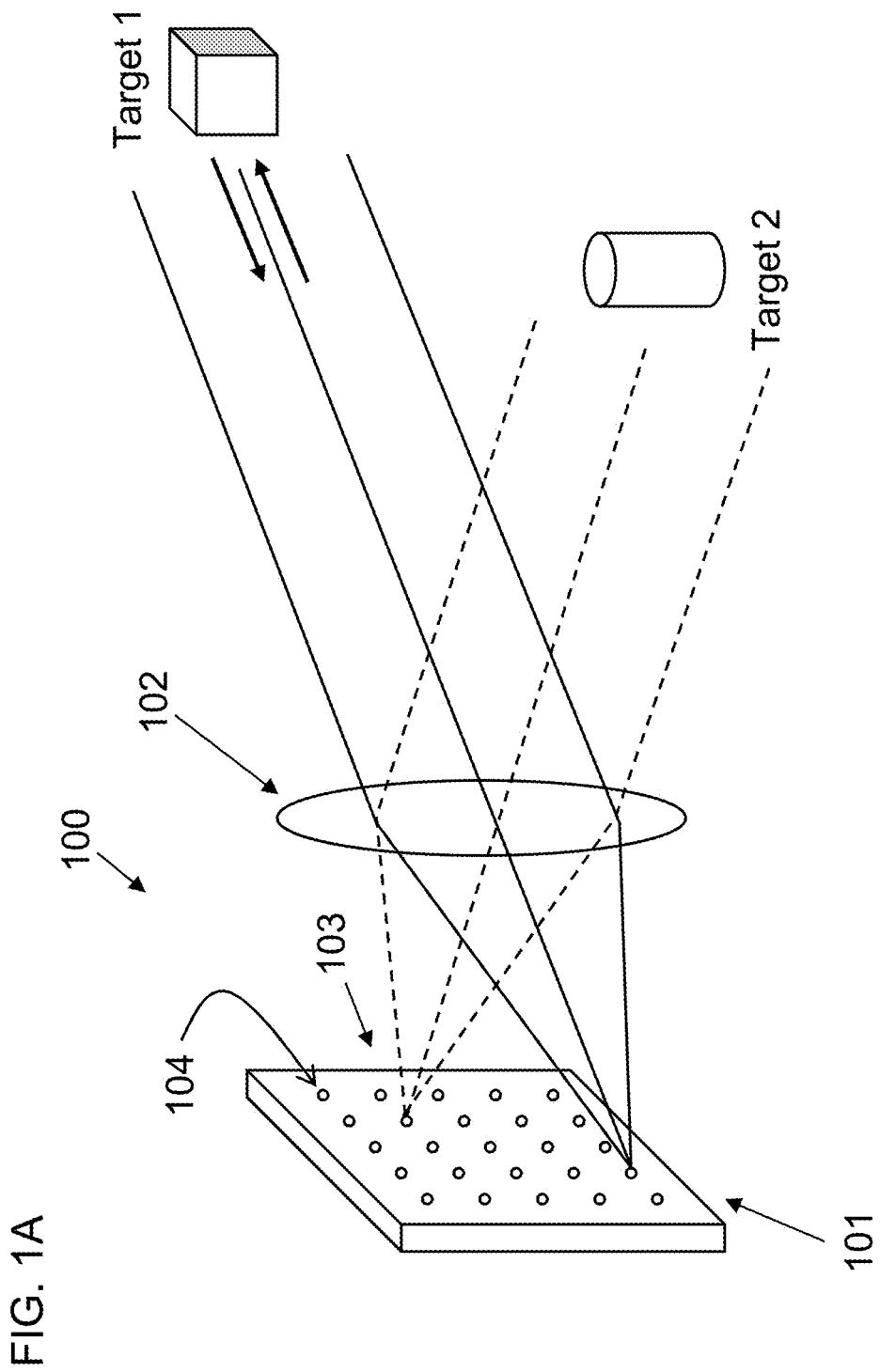
FIG. 1A is one example of imaging-based LiDAR.

An imaging LiDAR system is provided, comprising a lens, at least one light emitter, at least one light detector, an antenna array comprising a plurality of optical antennas, a programmable optical switch network configured to provide an optical path from the at least one light emitter to a selected transmit optical antenna and from a selected receiving antenna to the at least one detector, a microlens array comprising a plurality of microlenses corresponding to the plurality of optical antennas of the antenna array, the microlens array being disposed between the plurality of optical antennas and the lens, wherein the microlens array is positioned approximately at a focal plane of the lens and the antenna array is positioned approximately at a focal plane of the microlens array; wherein each microlens of the microlens array is positioned so as to transform an emission angle from a corresponding optical antenna to match a chief ray angle of the lens.

In some embodiments, the microlens array selected from the group consisting of silicon, glass, silicon nitride, polymers, photoresists, plastic, ceramic, dielectric, and other semiconductor materials.

In one embodiment, each microlens is selected from the group consisting of Fresnel lens, meta lens, metasurface lens, an any other artificially synthesized lens.

In some examples, the microlens array further comprises an anti-reflection coatings on one or more surfaces.

In some embodiments, the lens is selected from the group consisting of a single lens, a compound lens, a multiple-element lens, a smartphone lens, and a telephoto lens.

In other examples, the system further comprises a spacer disposed along at least one edge of the antenna array, the spacer being configured to maintain an optimal spacing in which the microlens array is positioned approximately at the focal plane of the lens and the antenna array is positioned approximately at the focal plane of the microlens array.

In one embodiment, the spacer and the microlens array form a sealed cavity.

In another embodiment, the sealed cavity is hermetic.

In some embodiments, the plurality of optical antennas comprise separate transmit and receive optical antennas and separate optical paths connecting to these separate transmit and receive optical antennas.

In one example, the microlens array comprises a single-sided design. In other examples, the microlens array comprises a double-sided design.

In some examples, the microlens array is periodic and the antenna array is periodic. In other examples, the microlens array is not periodic and the antenna array is periodic, or vis versa.

In some examples, the microlens array and the antenna array both have fiducial markers configured to allow for alignment and permanent attachment.

In other embodiments, the plurality of optical antennas have an emission angle of 8° and a beam divergence angle of 30°. In one specific example, the microlens array is configured to convert the beam divergence angle to 22° and the emission chief ray angles (CRA) to a value ranging between 0°~37°.

A programmable integrated circuit (PIC) for an imaging LiDAR system is provided, comprising an antenna array comprising a plurality of optical antennas, a programmable optical switch network configured to provide an optical path to a selected transmit optical antenna and from a selected receiving antenna; and a microlens array comprising a plurality of microlenses corresponding to the plurality of optical antennas of the antenna array, wherein the antenna array is positioned approximately at a focal plane of the microlens array, wherein each microlens of the microlens array is positioned so as to transform an emission angle from a corresponding optical antenna to match a chief ray angle of a lens of the imaging LiDAR system.

In some embodiments, the microlens array selected from the group consisting of silicon, glass, silicon nitride, polymers, photoresists, plastic, ceramic, dielectric, and other semiconductor materials.

In other embodiments, each microlens is selected from the group consisting of Fresnel lens, meta lens, metasurface lens, an any other artificially synthesized lens.

In one example, the microlens array further comprises an anti-reflection coatings on one or more surfaces.

In another embodiment, the PIC further comprises a spacer disposed along at least one edge of the antenna array, the spacer being configured to maintain an optimal spacing in which the antenna array is positioned approximately at the focal plane of the microlens array.

In some examples, the spacer and the microlens array form a sealed cavity. In one embodiment, the sealed cavity is hermetic.

In some examples, the plurality of optical antennas comprise separate transmit and receive optical antennas and separate optical paths connecting to these separate transmit and receive optical antennas.

In one example, the microlens array comprises a single-sided design. In other examples, the microlens array comprises a double-sided design.

In some examples, the microlens array is periodic and the antenna array is periodic. In other examples, the microlens array is not periodic and the antenna array is periodic, or vis versa.

In some embodiments, the microlens array and the antenna array both have fiducial markers configured to allow for alignment and permanent attachment.

In one example, the plurality of optical antennas have an emission angle of 8° and a beam divergence angle of 30°. In one specific example, the microlens array is configured to convert the beam divergence angle to 22° and the emission chief ray angles (CRA) to a value ranging between 0°~37°.

A method of performing LiDAR imaging is provided, comprising the steps of controlling a programmable optical network to provide a first light path from at least one light emitter to a selected transmit optical antenna of an antenna array of the optical network, positioning a microlens array such that the microlens array is positioned approximately at a focal plane of a lens and the antenna array is positioned approximately at a focal plane of the microlens array, the microlens array comprising a plurality of microlenses corresponding to the antenna array, and transforming an emission angle of the selected transmit optical antenna to match a chief ray angle of the lens.

A method of fabricating a programmable integrated circuit (PIC) for an imaging LiDAR system is provided, comprising forming an optical antenna array with a photolithography process, the optical antenna array comprising a plurality of optical antennas, forming a programmable optical switch network with the photolithography process, the programmable optical switch network being configured to provide an optical path to a selected transmit optical antenna and from a selected receiving antenna, and forming a microlens array with a photolithography process, the microlens array comprising a plurality of microlenses corresponding to the plurality of optical antennas of the antenna array, wherein the antenna array is positioned approximately at a focal plane of the microlens array, wherein each microlens of the microlens array is positioned so as to transform an emission angle from a corresponding optical antenna to match a chief ray angle of a lens of the imaging LiDAR system.

In some examples, the optical antenna array, the programmable optical switch network, and the microlens array are formed from a material selected from the group consisting of silicon, glass, silicon nitride, polymers, photoresists, plastic, ceramic, dielectric, and other semiconductor materials.

In some examples, the method further comprises forming a spacer with a photolithography process, the spacer being configured to maintain an optimal spacing in which the antenna array is positioned approximately at the focal plane of the microlens array.

In one example, the spacer and the microlens array form a sealed cavity.

In another example, the sealed cavity is hermetic.

DETAILED DESCRIPTION

The present disclosure is directed to imaging LiDARs with a microlens array between the imaging lens and the focal plane optical antenna array to match the emission angles from the antenna and the acceptance angles of the imaging lens.

One example schematic of a monostatic imaging LiDAR 100 is shown in FIG. 1A. A photonic integrated circuit (PIC) 101 with a two-dimensional (2D) array 103 of optical antennas is placed at the focal plane of an imaging lens 102. An optical switch network in the PIC selectively activates one or more optical antennas 104 at a time. Each activated optical antenna transmits light to a certain direction (Tx) and the same antenna receives reflected light from target (Rx). This creates a one-to-one mapping between the lateral position of the optical antenna and the far-field angle, as illustrated by the optical beam paths from two separate optical antennas pointing to Target 1 and Target 2. This is referred to herein as monostatic LiDAR, in which the transmitter and the receiver share the same optical antenna. The Tx and the Rx far-field angles are automatically aligned, but the LiDAR receiver is susceptible to residue reflections in the shared optical path and antenna. Residue reflections can comprise unwanted reflections caused by some elements in the optical path from the light source (laser) to the target. These residue reflections can also be delivered to the receiver and they can potentially hinder the detection of the real target signal (especially for weak target signals at longer distances).

Grating couplers are frequently used as optical antennas. Other structures such as prisms, 45-degree (or other angles) mirrors, or end-firing bent waveguides can also be used.

Figure 1B:
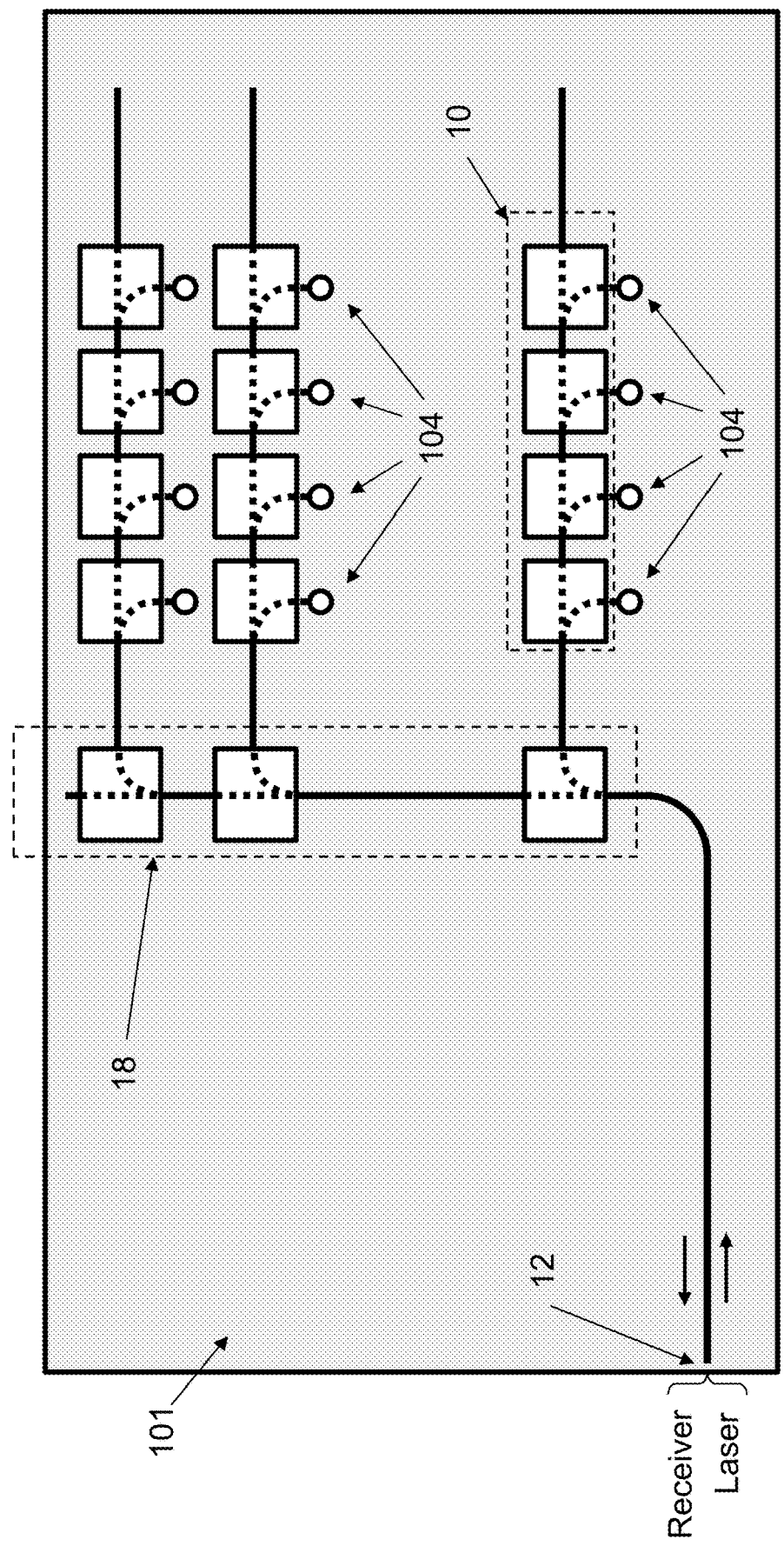
FIG. 1B shows a programmable optical switch network can connect a selected Tx antenna to the laser and a Rx antenna in the same pair to the receiver.

A programmable optical switch network can connect the selected Tx antenna to the laser and the Rx antenna in the same pair to the receiver. Suitable programmable optical switch networks for connecting the monostatic antenna arrays have been described by US Pub. No. US2021/0116778 which is incorporated herein by reference. FIG. 1B illustrates a programmable optical network on a PIC 101 that uses a 1×M switch (row selection switch 18) to select the active row and a 1×N switch (column selection switch 10) to select the optical antenna 104 (FIG. 1B shows a M×N array of optical antennas 104). The programmable optical network can be coupled to a receiver and a laser, as shown. The laser light is modulated, either directly or through a modulator, to generate interrogating light. In pulsed time of flight system, the laser is modulated to produce short (~nanosecond) optical pulses, and the receivers are made of avalanche photodiodes (APD) or single photon avalanche diodes (SPAD). In frequency-modulated continuous-wave (FMCW) system, the laser frequency increases or decrease linearly with time. Coherent receivers mix the received light signals with part of the laser light (called local oscillator or LO) in p-i-n photodidoes or APDs to extract the beat frequencies. The p-i-n photodiodes or APDs are often arranged in balanced configuration to extract the difference signals. This system is referred to as FMCW LiDAR or coherent LiDAR. In this example, the 1×M switch comprises M 1×2 switches and the 1×N switch comprises N 1×2 switches. Other possible arrangements are discussed in US Pub. No. US2021/0116778. As mentioned earlier, the Tx and Rx in this embodiment share not only the optical antenna but also the common optical path including waveguides, optical switches, and the input/output coupler 12.

Figure 2:
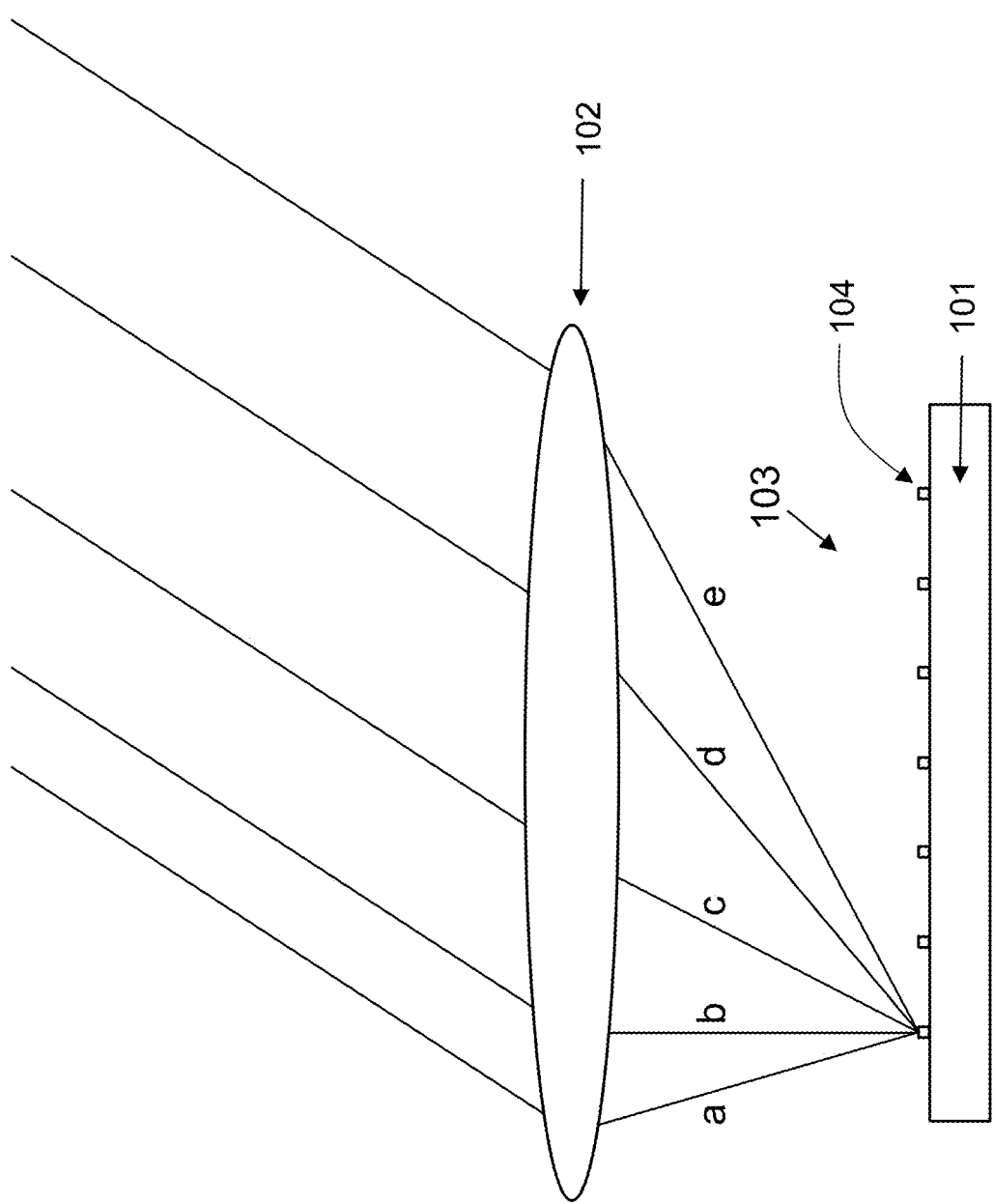
FIG. 2 is the cross-sectional view of the imaging-based LiDAR with an ideal lens. Optical antenna can emit light in any direction towards the ideal lens with unlimited acceptance angle.

FIG. 2 also shows a PIC 101 with a two-dimensional (2D) array 103 of optical antennas 104 placed at the focal plane of an imaging lens 102. An optical switch network in the PIC selectively activates one or more optical antennas 104 at a time. To achieve maximum optical efficiency, the emission angle of the optical antennas should match the acceptance angles of the lens. If the lens has infinite acceptance angle, the optical antenna can emit at any angles towards the lens and the light will be directed towards the target, as illustrated by emitted beams a-e in FIG. 2.

Figure 3A:
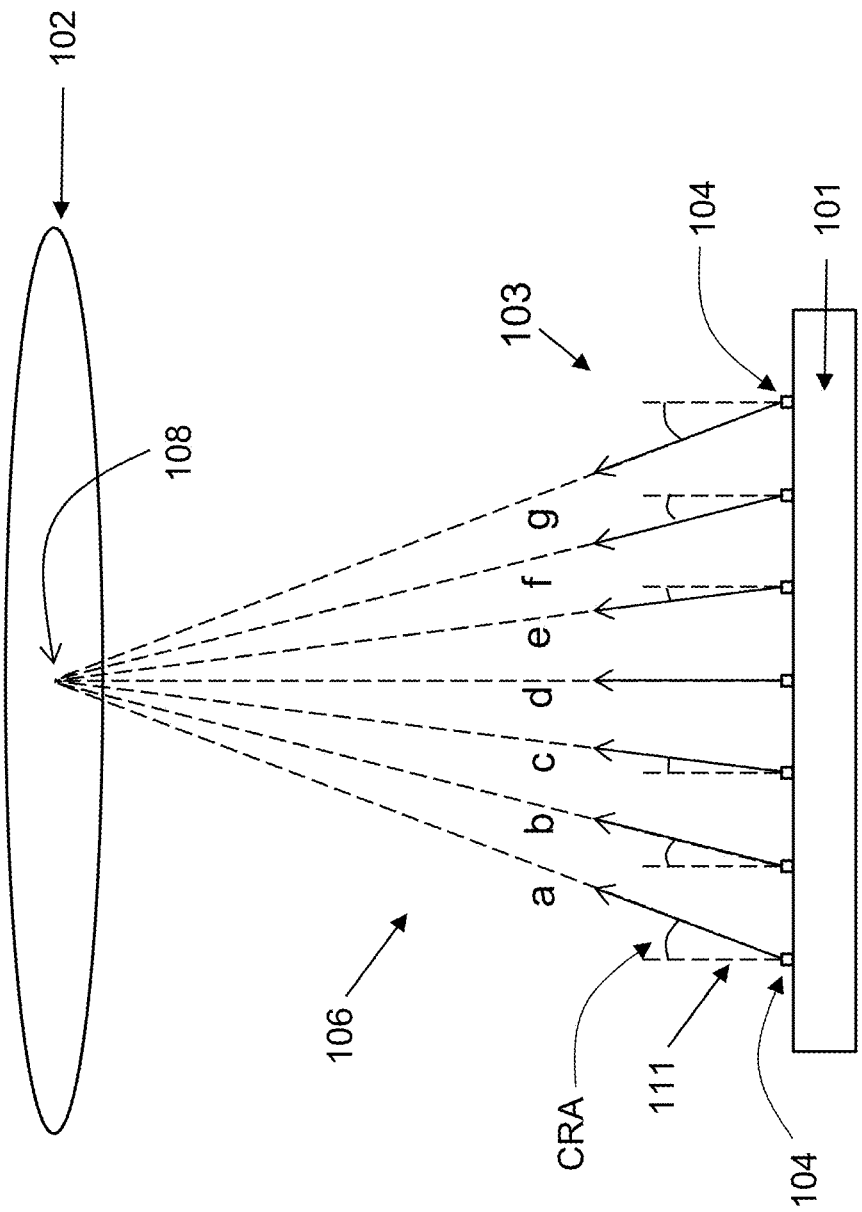
FIG. 3A illustrates the chief ray angle (CRA) of the imaging lens for various positions on the focal plane. In some lenses, the extensions of the CRA lines converge at the center of the exit pupil on the image side.

However, referring to FIG. 3A, practical imaging lenses, particularly those with multiple elements, have finite acceptance angles for each pixel in the focal plane. The acceptance angle for the lens 102 of FIG. 3A is dependent on the position of the pixel (e.g., the optical antenna in question). In this example, the acceptance angle comprises a light cone 106 around the chief ray angle (CRA) for each optical antenna 104, which is defined as the angle between the emitted beams (e.g., a, b, c, d, e, f, g, etc.) connecting each pixel/optical antenna to the center 108 of the lens aperture (which is also the exit pupil on the image side) and the normal 111 to the focal plane.

Figure 3B:
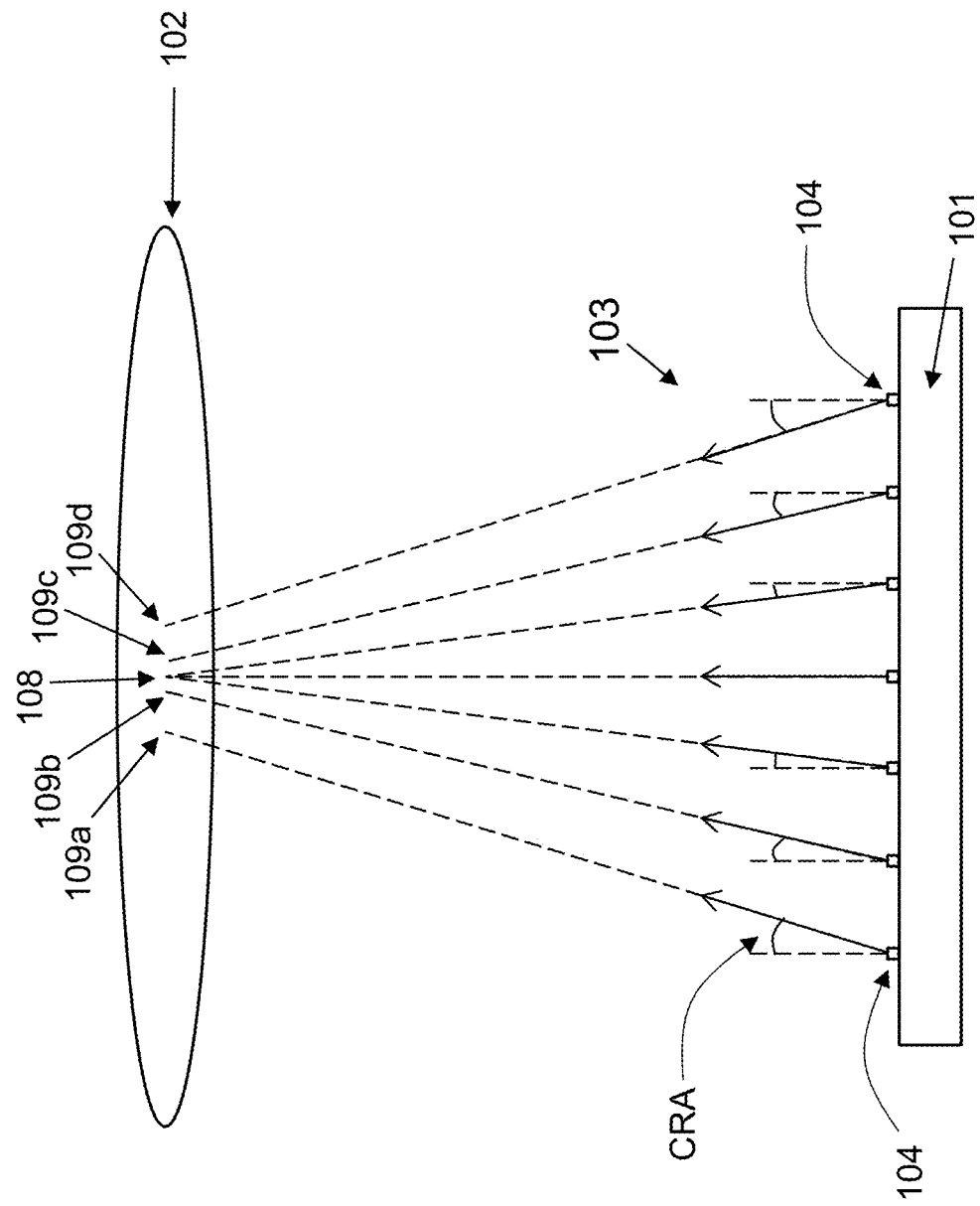
FIG. 3B illustrates the CRAs of general lenses. In some lenses, particularly lenses with multiple elements, the extensions of the CRA lines do not necessarily intersect at the same point.

For some lenses, e.g., multi-element lenses, the extensions of the CRAs might not intersect at a single central point. Instead, as illustrated in FIG. 3B, extensions of the CRAs can pass through two or more points in the multi-element lens 102 that may not be at the center 108 of the multi-element lens, as illustrated by points 109a-109d.

In principle, the optical antennas in each pixel can be optimized or configured to emit at an angle approximately equal to the CRA. For example, one can control the pitch and the orientation of a grating coupler, as taught in US Patent Pub. No. 2021/0116778. Similarly, for mirror or prism-based optical antennas, the angle and orientation of the mirror/prism can be adjusted. However, customizing the angles for each pixel poses a challenge to fabrication of mirrors and prisms. Grating couplers with different pitches can be patterned by photolithography, however, the emission angle is sensitive to fabrication variations. The grating diffraction efficiency and the back-reflection are also dependent on grating pitches.

Figure 4:
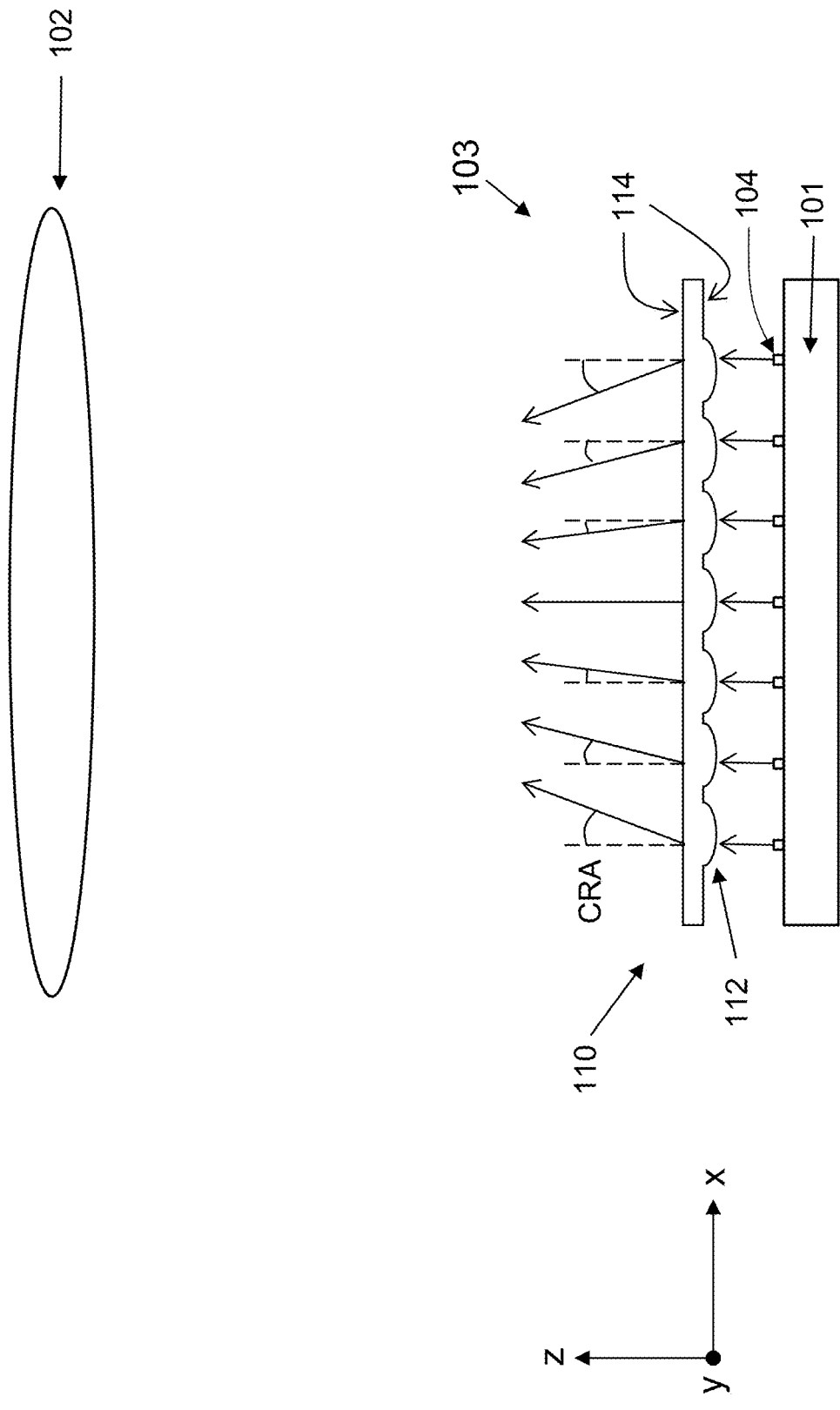
FIG. 4 illustrates the use of a microlens array between the lens and the focal plane optical antenna array to match the antenna emission angles and the CRAs of the lens. The microlens array is anti-reflection-coated to minimize reflections.

The present disclosure provides a novel microlens array configured to transform the emission angles from one or more optical antennas to match the CRAs of the imaging lens. One example of the embodiment is shown in FIG. 4. In this example, a microlens array 110 comprising a plurality of microlenses 112 is disposed between the imaging lens 102 and the optical antenna array 103. In one example, the microlens array can be formed with a photolithography process. While the microlens array in this example is shown as a single-sided design, it should be understood that this embodiment, or any other microlens embodiment described herein, can also be implemented as a double-sided design. In some embodiments, the microlens array can comprise one or more anti-reflective coating(s) 114 disposed on one or more sides of the array. The distance between the lens 102 and the microlens array 110 can be approximately the focal length of the lens, and the distance between the microlens array 110 and the optical antenna array 103 can be approximately the focal length of the microlens. A microlens 112 can be positioned on top of each optical antenna, but the center of each microlens is offset laterally relative to its corresponding optical antenna 104 to bend the optical beams. The beam angle after passing through each microlens is equal to $\tan^{-1}(\delta r/f_{ml})$, where or is the lateral offset between the centers of each microlens and its corresponding optical antenna in x-y plane (see FIG. 4 for the definition of the coordinates), and $f_{ml}$ is the focal length of the microlens. Since the microlens is fabricated by photolithography, each microlens position can be precisely defined to match the output angle to the CRA of each corresponding individual pixel or optical antenna.

Figure 5:
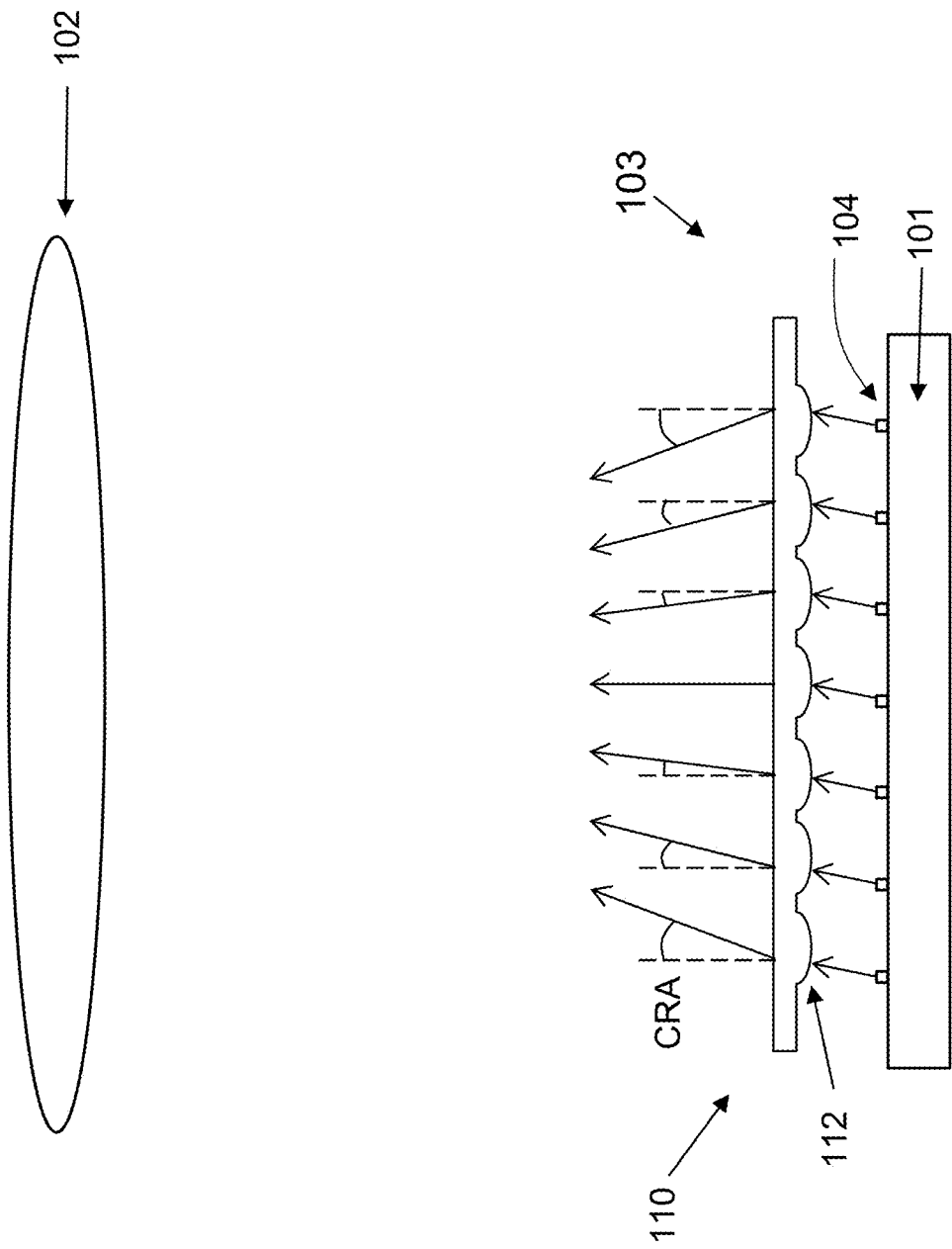
FIG. 5 shows that the microlens array can match the emission angles with the CRAs of the lens even when the emission angles are not 90 degrees (or perpendicular to the focal plane).

It should be noted that the beam angle after the beam passes through the microlens only depends on the offset between the microlens and the optical antenna. To a large extent, it is independent of the emission angle from the optical antenna, provided the optical beam overlaps with the microlens. This is illustrated in FIG. 5, where it is shown that the microlens array can be configured to match the emission angles with the CRAs of the lens even when the emission angles from the optical antennas are not 90 degrees (or perpendicular to the focal plane). This allows the optical antenna to be optimized for high efficiency without constraint in the emission angle. It also has a large tolerance to fabrication variation of the optical antenna. Even if the emission angle from one or more of the optical antennas differs from the designed angle, the microlens array can still produce an output angle matched to the CRA of the lens.

Though the examples described here use refractive microlens arrays, other microlenses such as Fresnel lenses, meta lenses, metasurface lenses, or other artificially synthesized lenses can be used. The microlens can be made in silicon, silicon dioxide, silicon nitride, polymers, plastics, photoresists, or ceramic, dielectric, semiconductor materials, or composite materials. The microlenses can be made by top-down fabrication, injection molding, reflow, or other methods.

Figure 6B:
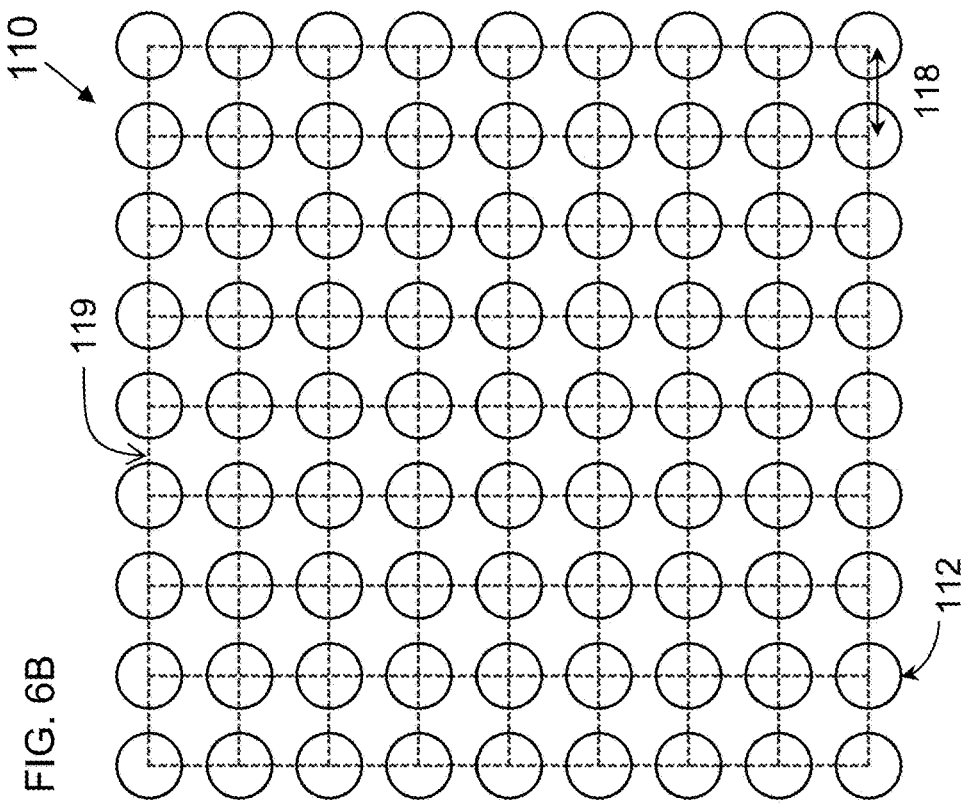
FIGS. 6A-6B show one example layout of the optical antennas and the microlens array. Both are two-dimensional arrays with regular pitches, but the pitch of the microlens array is different from that of the antenna array.
Figure 6A:
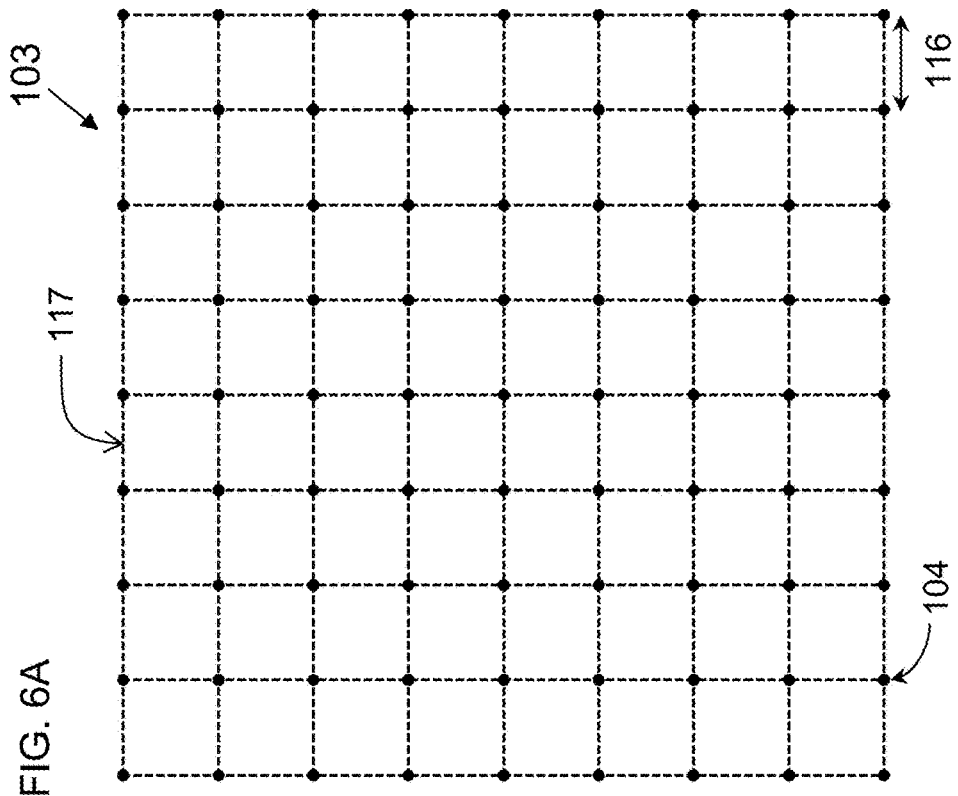

FIGS. 6A-6B show an example layout of the optical antenna array and the microlens array. FIG. 6A illustrates the optical antenna array 103, where each optical antenna 104 is represented by a dot. FIG. 6B illustrates the microlens array 110, and each microlens 112 is represented by a circle. In this embodiment, both the optical antennas and the microlenses are two-dimensional (2D) arrays with regular, but different, pitches. For example, the optical antenna pitch 116 is different than the microlens pitch 118. In some embodiments, the pitch difference can be on the order of tens of nanometers to tens of micrometers. Pitch difference is a fraction of the antenna array design and the lens parameters. Optical antenna grid pattern 117 represents the pitch between adjacent optical antennas, and microlens grid pattern 119 represents the pitch between adjacent microlenses.

Figure 7:
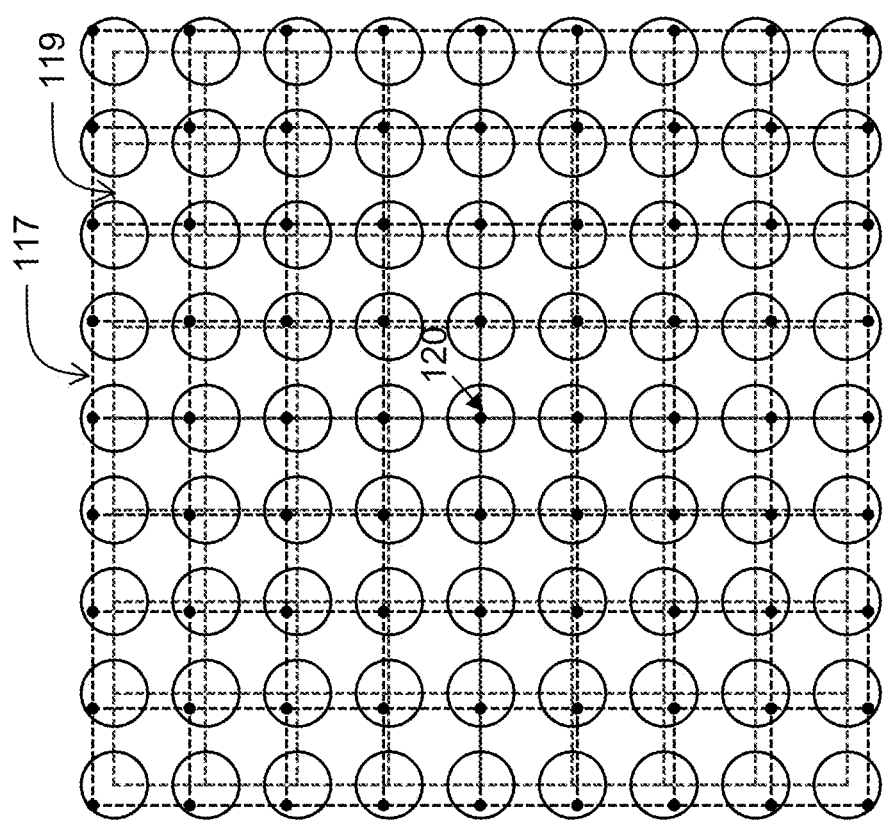
FIG. 7 shows the overlay of the optical antenna array and the microlens array. The offset between the microlens and the antenna is designed to bend the optical beams from the optical antennas to match the CRAs of the lens. The microlens array also works for the received optical beams in a reciprocal way.

FIG. 7 shows an overlay of the optical antenna and microlens arrays from FIGS. 6A-6B. With a 9×9 grid of optical antennas and microlenses, this example provides a total of 81 optical antennas and 81 corresponding microlenses. At the center 120 of the overlay, the central optical antenna and the center of the microlens are aligned exactly. This leads to vertical output beam. For pixels or optical antennas away from the center of the array, the microlens position is offset towards the center of the array, and the optical antennas are offset outwards from the center of each corresponding microlens. As shown in FIG. 7, the disparity between the optical antenna grid pattern 117 and the microlens grid pattern 119 can be clearly seen. The amount of offset between each respective microlens and optical antenna pair increases with the distance to the center of the array because the CRA usually increases from the center towards the edges of the imaging plane.

Figure 8B:
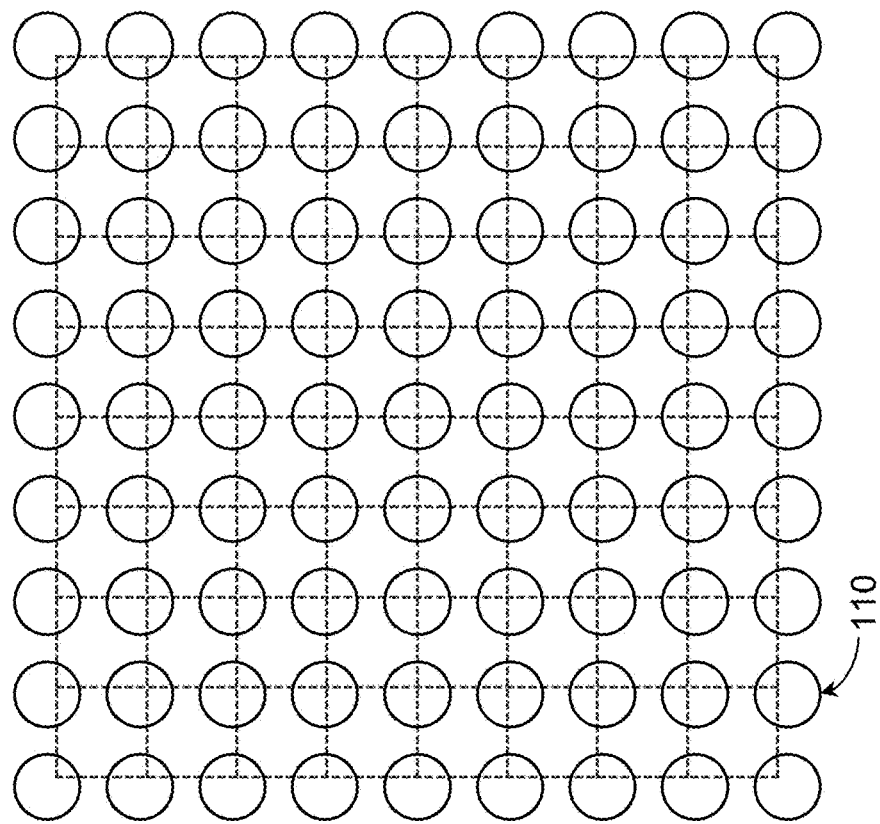
FIGS. 8A-8B show one example layout in which the optical antenna array, the microlens array, or both, is aperiodic. The offset between the microlens and the antenna is customized at each antenna (pixel) to match the emission angle of the antenna and the CRA of the lens.
Figure 8A:
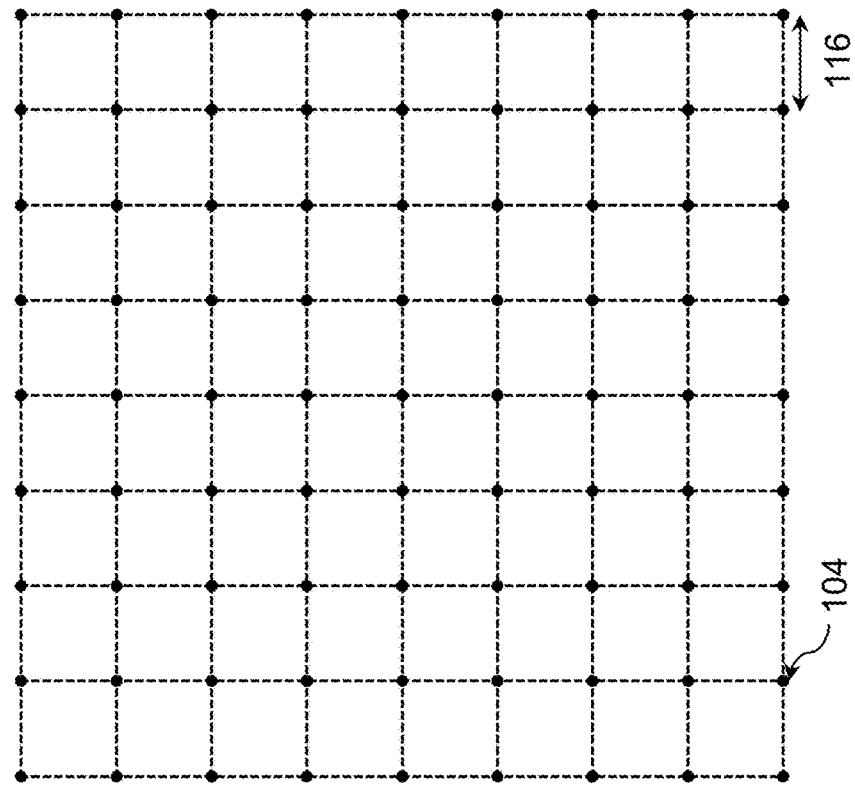

The microlens array does not need to be periodic (e.g., uniform distance between adjacent microlenses). In some examples, the position of each microlens in the array can be optimized for each optical antenna to match the CRA of the lens, as illustrated in FIGS. 8A-8B. Thus, in the example of FIG. 8A, the optical antenna pitch 116 can be uniform or periodic, but in FIG. 8B, the microlens pitch 118 between the various microlenses is not periodic or uniform, but is instead optimized to match the CRA of the lens. In another embodiment, the optical antenna array does not need to be periodic either. The microlens position can still be optimized for aperiodic optical antenna array.

Figure 9:
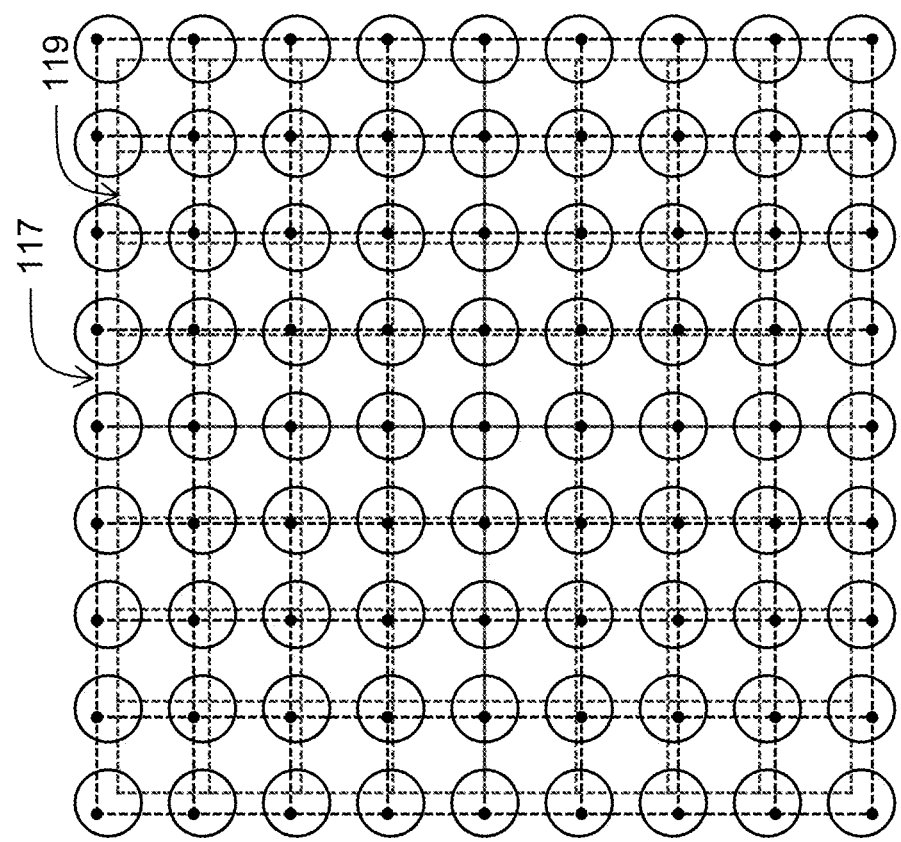
FIG. 9 shows the overlay of the optical antenna array and the aperiodic microlens array.

FIG. 9 shows the disparity between the optical antenna grid pattern 117 and the microlens grid pattern 119 when the microlens array is not periodic. While the overlay between the optical antenna grid pattern 117 and the microlens grid pattern 119 is the same as shown in the embodiment of FIG. 7, the amount of offset between each respective microlens and optical antenna pair is less than in the FIG. 7 embodiment due to the microlens array being non-periodic. Specifically, in the FIG. 7 embodiment, especially towards the periphery of the array, the optical antennas are positioned closer to the edges of their corresponding microlenses. However, in this embodiment of FIG. 9, the microlenses are spaced further apart at the periphery of the array, allowing the optical antennas to be more centrally positioned within each of their respective microlenses.

Figure 10:
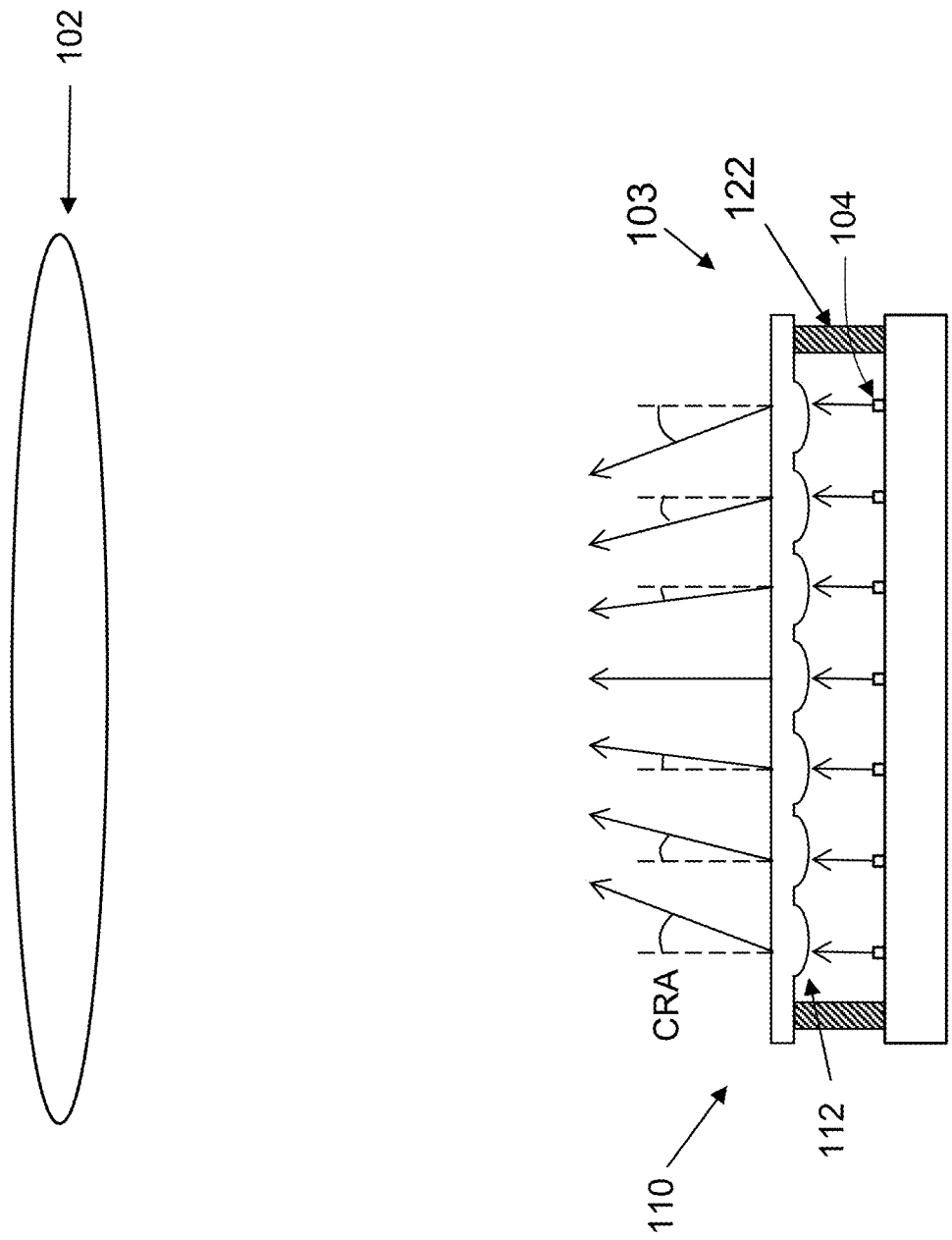
FIG. 10 is one example in which the microlens array is part of the encapsulation of the focal plane optical antenna array with the gap spacing defined by a spacer.

FIG. 10 illustrates a microlens array 110 of microlenses 112 that can be assembled with the optical antenna array 103 of optical antennas 104 at wafer or chip scale. In some embodiments, fiducial markers can be placed on both the microlens array and the optical antenna array. They can be aligned and permanently attached using flip-chip bonding or wafer bonding equipment. A spacer 122 with a height approximately equal to the focal length of the microlens can be fabricated on either the microlens array or the optical antenna array. The spacer can then be configured to precisely define the spacing between the microlens and the optical antenna array 103. The enclosed spacer can additionally provide a hermetic sealing to optical antennas, which can be beneficial if MEMS actuators are used in the optical switch networks. In some embodiments, the spacer can be fabricated from the same material as the microlens (e.g., silicon, silicon dioxide, silicon nitride, polymers, plastics, photoresists, or ceramic, dielectric, semiconductor materials, composite materials, or metal such as gold.)

Figure 11:
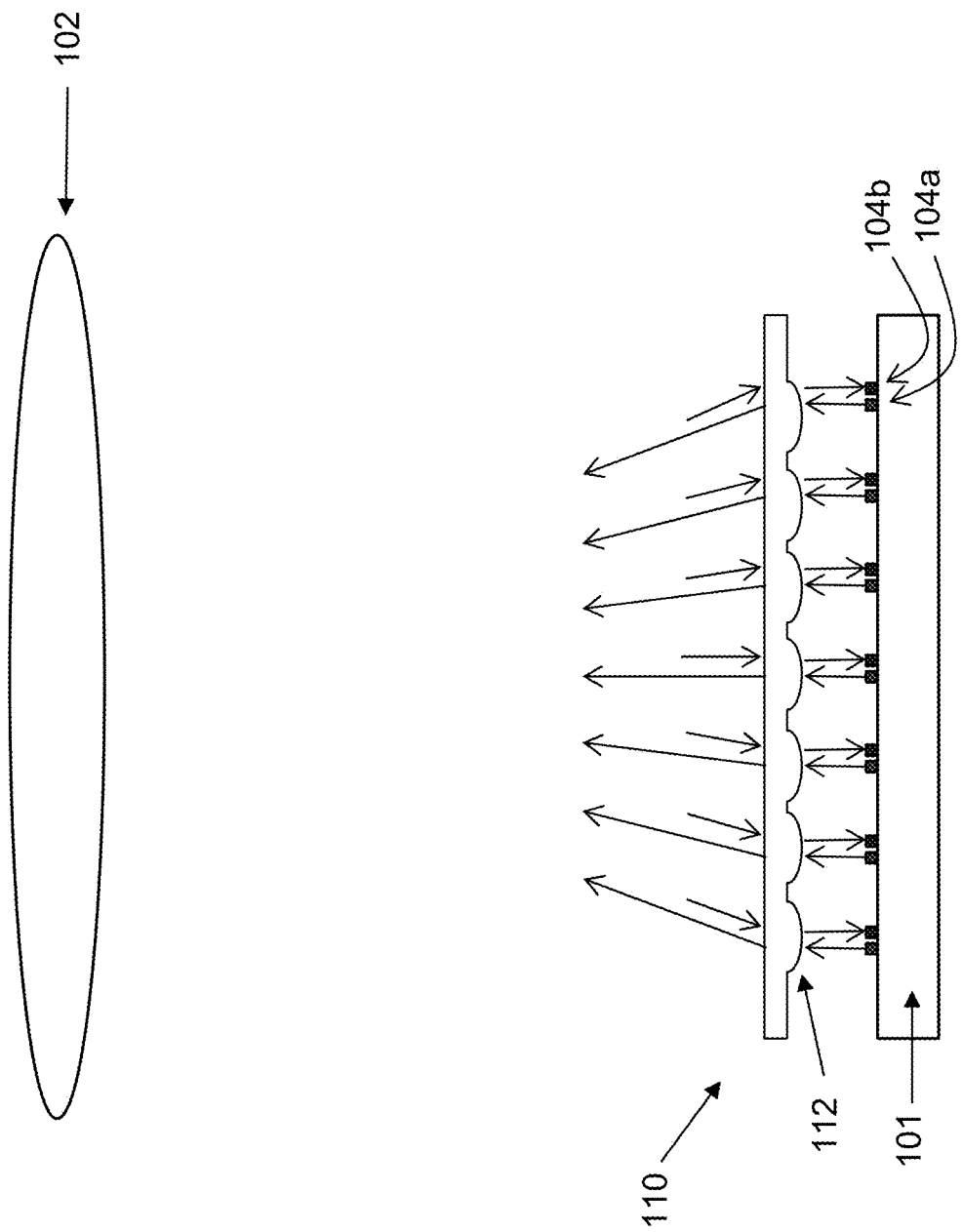
FIG. 11 illustrates the use of the microlens array in imaging-based pseudo-monostatic LiDAR with separate optical antennas for transmit and receive functions.

The optical scheme disclosed here is not limited to one optical antenna per pixel. FIG. 11 shows an embodiment for imaging LiDARs with multiple optical antennas per pixel. For example, pseudo-monostatic imaging LiDARs use separate transmit optical antennas 104a and receive optical antennas 104b to reduce crosstalk and residue reflections. Alternatively, receive antennas with orthogonal polarizations can be used to implement polarization-diversity receiver at each pixel. In these examples, the optical antennas can be placed in close proximity (e.g., on the order of hundreds of nanometers to several micrometers) so the corresponding beam angles after the microlens are sufficiently close to the CRA of the pixel.

EXAMPLES

Figure 12:
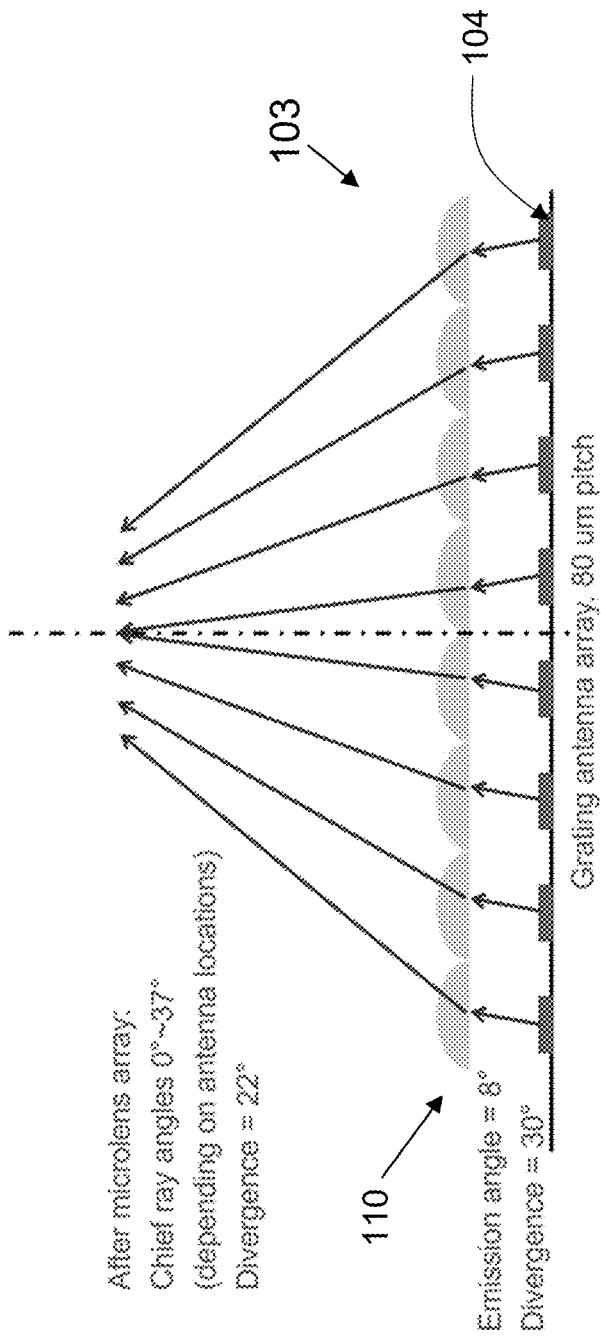
FIG. 12 is a specific example of an optical antenna array of optical antennas used in conjunction with a microlens array.

FIG. 12 is a specific example of an optical antenna array 103 of optical antennas 104 used in conjunction with a microlens array 110 as described above. In this example, the array has a pitch of 80 µm, and the optical (grating) antennas have an emission angle of 8° and a divergence angle of 30°. In this embodiment, the microlens array 110 is configured to convert the beam divergence to 22° and the emission chief ray angles (CRA) to a value in the range 0°~37° depending on the optical antenna locations. This example also assumes that the microlens array is made of silicon (refractive index n=3.48) and has a thickness of 250 µm.

Figure 13:
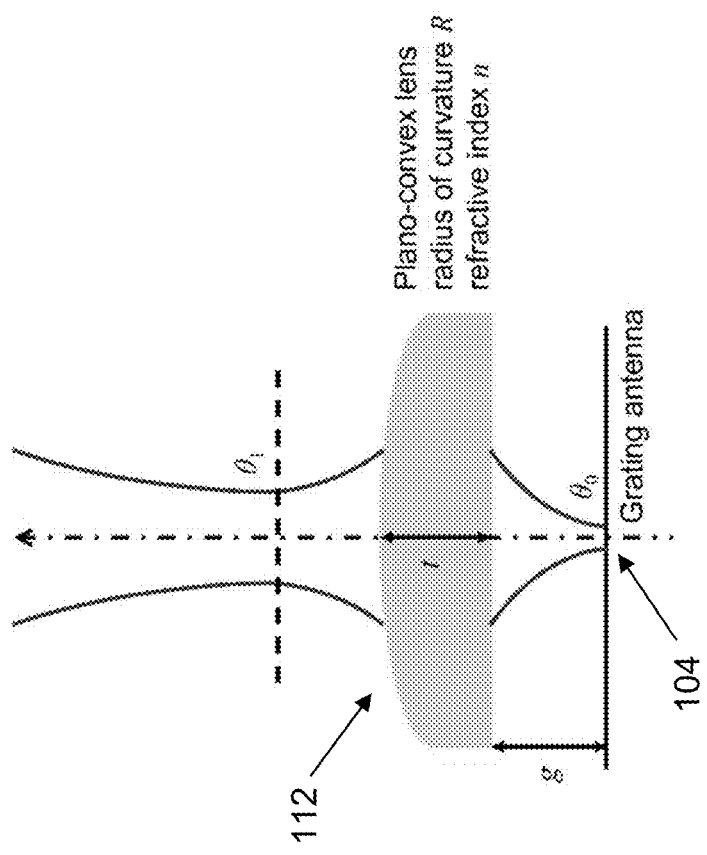
FIG. 13 is a schematic diagram analyzing how a microlens (e.g., from the array of FIG. 12) converts the beam divergence angle.

FIG. 13 is a schematic diagram analyzing how a microlens 112 (from the array of FIG. 12) converts the beam divergence angle. In this example, the emitted beam is modeled from the grating antenna as a Gaussian beam with a divergence $\theta_0=30°$ and a wavelength of 1550 nm. To simplify the analyses, it is assumed that the Gaussian beam propagates along the optical axis of the microlens. The plano-convex shaped microlens with a top surface radius of curvature R, a thickness of t=250 µm, and a refractive index of n=3.48 is placed above an optical antenna 104 with an air gap g.

The Gaussian beam parameters after the microlens can be approximately calculated using the ABCD matrix method. The ABCD matrix of the system can be computed by multiplying the propagation ABCD matrix in the air gap:

$$\begin{bmatrix} 1 & g \\ 0 & 1 \end{bmatrix} \quad \text{Equation 1}$$

by the thick lens ABCD matrix:

$$\begin{bmatrix} 1 & \frac{t}{n} \\ \frac{n-1}{-R} & 1 - \frac{t(n-1)}{nR} \end{bmatrix} \quad \text{Equation 2}$$

Figure 14:
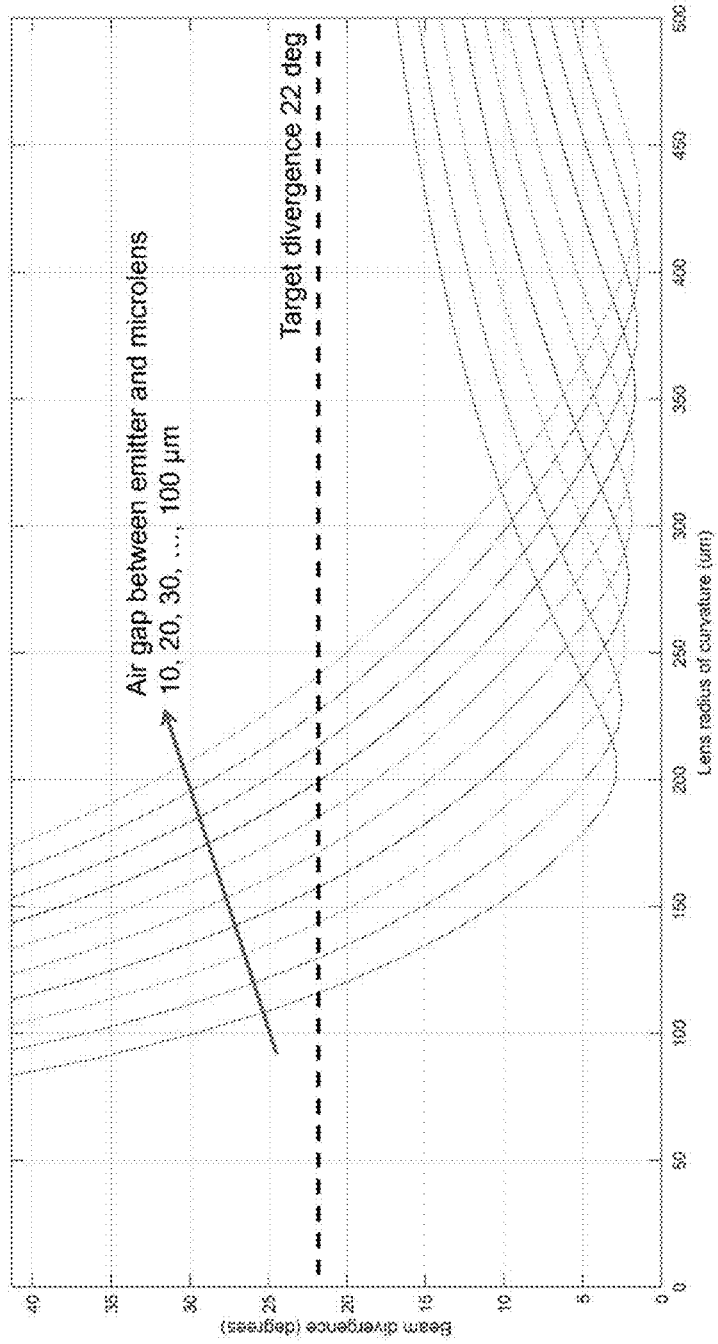
FIG. 14 shows a calculated beam divergence angle $\theta_1$ after the microlens as a function of the microlens radius of curvature R at several different air gap g.

FIG. 14 shows the calculated beam divergence angle $\theta_1$ after the microlens as a function of the microlens radius of curvature R at several different air gap g. The design goal $\theta_1=22°$ is indicated by the dashed line. The analytical calculations provide a guideline for selecting the microlens parameters, for example, a radius of curvature of 115 µm and an air gap of 10 µm.

Figure 15A:
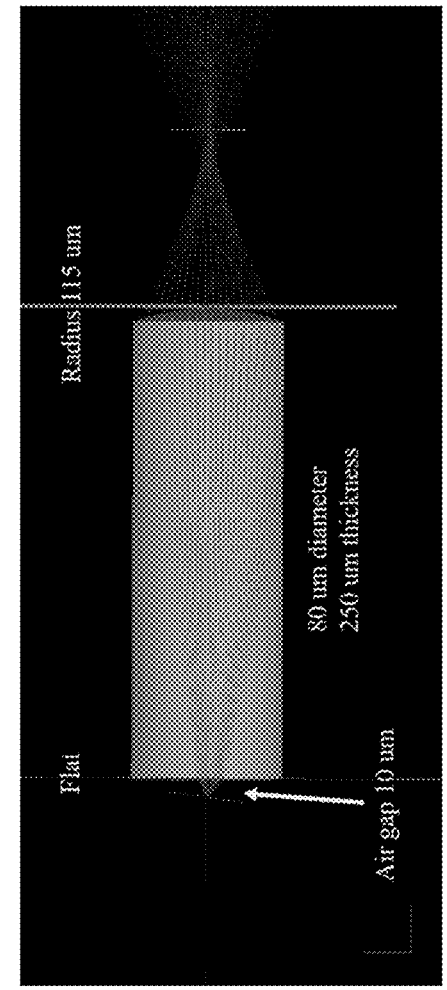
FIG. 15A is a simulated model where the microlens comprises a single-sided microlens.
Figure 15B:
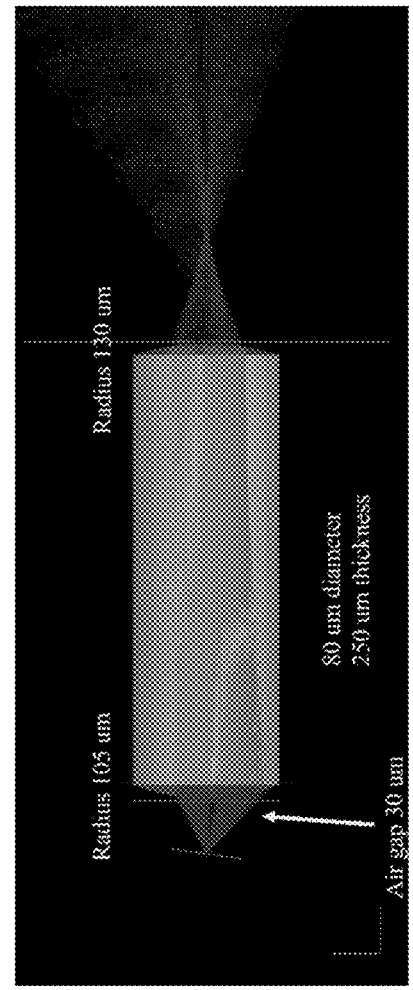
FIG. 15B is a simulated model where the microlens comprises a double-sided microlens.

The model in the previous section includes a single-sided (plano-convex) microlens where the lens surface facing the grating antenna is flat. An example design with R=115 µm and g=10 µm is shown in FIG. 15A (simulated by the FRED software). In the example of FIG. 15B, microlens can also be double-sided where both surfaces are curved. In both simulations of FIGS. 15A-15B, the emission angle of the grating antenna is set to 8°.

In the single-sided design shown in FIG. 15A, it can be observed that some of the rays are clipped by the sidewall of the microlens, resulting in a loss of optical efficiency. In contrast, in the double-sided design in FIG. 15B, the first lens surface collimates the light proparating inside the microlens, thus there is no ray clipping loss. However, this collimation relys on a precise gap between the grating antenna and the microlens which requires high fabrication and packaging accuracy.

To achieve the CRA design goal stated above, i.e. change the CRA of the beam after the microlens, each optical antenna needs to be offset from the optical axis of the microlens. The ray clipping loss and CRA after the microlens has been simulated in the FRED software based on the single-sided microlens design shown in FIG. 15A, and the simulation results are listed in Table 1. The simulation results confirm that the beam CRA after microlens can be controlled by offsetting the grating antenna from the microlens optical axis.

TABLE 1

Simulation results of efficiency and CRA after microlens versus grating antenna offset.

| Offset (µm) | Efficiency due to ray clipping loss | CRA after microlens (°) |
|---|---|---|
| −20 | 51.5% | −24.3 |
| −15 | 71.1% | −20.0 |
| −10 | 83.1% | −13.6 |
| −5 | 87.1% | −9.8 |
| 0 | 90.9% | −4.4 |
| 5 | 92.0% | 0.78 |
| 10 | 92.4% | 6.1 |
| 15 | 91.7% | 11.0 |
| 20 | 89.8% | 17.1 |
| 25 | 83.7% | 23.0 |
| 30 | 71.8% | 25.3 |

The systems and methods described herein can be used, for example, to perform range (distance) measurement in multiple directions. Additionally, the systems and methods described herein can be used to perform measurement of 3D point clouds. In some embodiments, the frame rate or speed of 3D point cloud measurement can be increased by turning on multiple pixels at the same time. In some examples, these multiple pixels can be powered by the same laser through an optical splitter. In other embodiments, the multiple pixels can be powered by separate lasers.

As for additional details pertinent to the present invention, materials and manufacturing techniques may be employed as within the level of those with skill in the relevant art. The same may hold true with respect to method-based aspects of the invention in terms of additional acts commonly or logically employed. Also, it is contemplated that any optional feature of the inventive variations described may be set forth and claimed independently, or in combination with any one or more of the features described herein. Likewise, reference to a singular item, includes the possibility that there are plural of the same items present. More specifically, as used herein and in the appended claims, the singular forms "a," "and," "said," and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation. Unless defined otherwise herein, all technical and scientific terms used herein have the same meaning as commonly understood by one of ordinary skill in the art to which this invention belongs. The breadth of the present invention is not to be limited by the subject specification, but rather only by the plain meaning of the claim terms employed.

What is claimed is:

1. An imaging LiDAR system, comprising:
   a lens having an aperture center;
   at least one light emitter;
   at least one light detector;
   an antenna array comprising a plurality of optical antennas;
   a programmable optical switch network configured to provide an optical path from the at least one light emitter to a selected transmit optical antenna and from a selected receiving optical antenna to the at least one light detector;
   a microlens array comprising a plurality of microlenses corresponding to the plurality of optical antennas of the antenna array, the microlens array being disposed between and spaced from each of the plurality of optical antennas and the lens, wherein the microlens array is positioned approximately at a focal plane of the lens and the antenna array is positioned approximately at a focal plane of the microlens array;
   wherein centers of at least some of the microlenses of the microlens array are offset relative to corresponding ones of the optical antennas so as to redirect light from the corresponding ones of the optical antennas toward the aperture center of the lens.

2. The system of claim 1, wherein the microlens array selected from the group consisting of silicon, glass, silicon nitride, polymers, photoresists, plastic, ceramic, dielectric, and other semiconductor materials.

3. The system of claim 1, wherein each microlens is selected from the group consisting of Fresnel lens, meta lens, metasurface lens, an any other artificially synthesized lens.

4. The system of claim 1, wherein the microlens array further comprises an anti-reflection coatings on one or more surfaces.

5. The system of claim 1, wherein the lens is selected from the group consisting of a single lens, a compound lens, a multiple-element lens, a smartphone lens, and a telephoto lens.

6. The system of claim 1, further comprising:
   a spacer disposed along at least one edge of the antenna array, the spacer being configured to maintain an optimal spacing in which the microlens array is positioned approximately at the focal plane of the lens and the antenna array is positioned approximately at the focal plane of the microlens array.

7. The system of claim 6, wherein the spacer and the microlens array form a sealed cavity.

8. The system of claim 7, wherein the sealed cavity is hermetic.

9. The system of claim 1, wherein the plurality of optical antennas comprise separate transmit and receiving optical antennas and separate optical paths connecting to these separate transmit and receiving optical antennas.

10. The system of claim 1, wherein the microlens array comprises a single-sided design.

11. The system of claim 1, wherein the microlens array comprises a double-sided design.

12. The system of claim 1, wherein the microlens array is periodic.

13. The system of claim 1, wherein the antenna array is periodic.

14. The system of claim 12, wherein the antenna array is periodic.

15. The system of claim 12, wherein the antenna array is not periodic.

16. The system of claim 13, wherein the microlens array is not periodic.

17. The system of claim 1, wherein the microlens array and the antenna array both have fiducial markers configured to allow for alignment and permanent attachment.

18. The system of claim 1, wherein the plurality of optical antennas have an emission angle of 8° and a beam divergence angle of 30°.

19. The system of claim 18, wherein the microlens array is configured to convert the beam divergence angle to 22° and an angle between an emission chief ray and a normal to a focal plane of the lens, to a value ranging between 0°-37°.

20. A programmable integrated circuit (PIC) for an imaging LiDAR system, comprising:
   an antenna array comprising a plurality of optical antennas;
   a programmable optical switch network configured to provide an optical path to a selected transmit optical antenna and from a selected receiving antenna; and
   a microlens array comprising a plurality of microlenses corresponding to the plurality of optical antennas of the antenna array, wherein the antenna array is positioned approximately at a focal plane of the microlens array;
   wherein centers of at least some of microlenses of the microlens array are offset relative to corresponding ones of optical antennas so as to redirect light from the corresponding ones of the optical antennas toward an aperture center of a lens of the imaging LiDAR system.

21. The system of claim 1, wherein the microlens array is configured to convert an angle between a chief ray and the normal to a focal plane of the lens, to a value ranging between 0°-37°.

22. The system of claim 1, wherein the plurality of optical antennas comprise the selected transmit optical antenna and the selected receiving optical antenna and the programmable optical switch network is configured to provide a first optical path from the at least one light emitter to the selected transmit optical antenna and a second optical path from the selected receiving optical antenna to the at least one light detector, wherein at least a portion of the first optical path is shared with the second optical path.

23. The system of claim 1, wherein the selected transmit optical antenna and the selected receiving optical antenna are optically connected to the at least one light emitter and the at least one light detector via a single coupler.

24. The system of claim 1, wherein the plurality of optical antennas comprises transmit optical antennas and receiving optical antennas, and wherein the transmit and receiving optical antennas transmit and receive light to and from a target via the lens and the microlens array.

25. The system of claim 1, wherein the selected transmit optical antenna comprises the selected receiving optical antenna.

26. The system of claim 9, wherein the selected transmit optical antenna and the selected receiving optical antenna transmit and receive light via a single microlens of the microlens array.

* * * * *